United States Patent
Weissbach et al.

(10) Patent No.: US 8,084,298 B2
(45) Date of Patent: Dec. 27, 2011

(54) METHOD FOR EXCHANGING SEMICONDUCTOR CHIP OF FLIP-CHIP MODULE AND FLIP-CHIP MODULE SUITABLE THEREFOR

(75) Inventors: Ernst-A Weissbach, Baldham (DE); Juergen Ertl, Geretsried (DE)

(73) Assignee: HTC Beteiligungs GmbH, Baldham (DE)

( * ) Notice: Subject to any disclaimer, the term of this patent is extended or adjusted under 35 U.S.C. 154(b) by 305 days.

(21) Appl. No.: 12/190,342

(22) Filed: Aug. 12, 2008
(Under 37 CFR 1.47)

(65) Prior Publication Data
US 2009/0085203 A1    Apr. 2, 2009

Related U.S. Application Data

(63) Continuation of application No. PCT/EP2007/001190, filed on Feb. 12, 2007.

(30) Foreign Application Priority Data

Feb. 13, 2006 (DE) .......................... 10 2006 006 561

(51) Int. Cl.
    *H01L 21/44* (2006.01)
(52) U.S. Cl. .......... 438/108; 438/17; 438/612; 438/613; 257/737; 257/778; 257/779; 257/E21.508; 257/E23.023
(58) Field of Classification Search .................. 438/107, 438/108, 612, 613; 257/737, 778, 779, E21.058, 257/E23.023
See application file for complete search history.

(56) References Cited

U.S. PATENT DOCUMENTS

| | | | |
|---|---|---|---|
| 4,858,820 | A | 8/1989 | Kent |
| 6,050,476 | A | 4/2000 | Yokoyama et al. |
| 6,182,884 | B1 | 2/2001 | Ma et al. |
| 6,225,206 | B1 | 5/2001 | Jimarez et al. |
| 6,357,648 | B1 | 3/2002 | Monno |
| 6,360,940 | B1 | 3/2002 | Bolde et al. |
| 6,550,666 | B2 | 4/2003 | Chew et al. |
| 6,578,754 | B1 | 6/2003 | Tung |
| 6,592,019 | B2 | 7/2003 | Tung |
| 2002/0014703 | A1 | 2/2002 | Capote et al. |

FOREIGN PATENT DOCUMENTS

DE    199 03 957 A1    7/2000

(Continued)

OTHER PUBLICATIONS

International Search Report dated Jun. 25, 2007, from PCT/EP2007/001190, filed on Feb. 12, 2007.

(Continued)

*Primary Examiner* — Andy Huynh
(74) *Attorney, Agent, or Firm* — Houston Eliseeva, LLP

(57) ABSTRACT

A process for replacing a semiconductor chip of such a flip-chip module and a suitable flip-chip module and an apparatus for implementing the method are disclosed. The flip-chip module comprises at least one semiconductor chip and a substrate. The semiconductor chip comprises contact posts on a surface that are disposed at right angles to the surface. With these contact posts it is connected with contact points of the substrate via a soldered connection. The contact posts completely cover the contact points with their end faces. Due to this it is possible to completely press the solder between the contact posts and contact points out of the intermediate area between the contact points and the contact posts after a renewed heating. This permits a renewed attachment of a further semiconductor chip.

3 Claims, 3 Drawing Sheets

FOREIGN PATENT DOCUMENTS

| | | |
|---|---|---|
| DE | 10 2005 050 150.8 | 10/2005 |
| DE | 10 2005 043 910 A1 | 3/2007 |
| JP | 11-126799 A | 5/1999 |
| WO | 2007/031298 A1 | 3/2007 |

OTHER PUBLICATIONS

English translation of the International Preliminary Report on Patentablity dated Sep. 9, 2008, from International Application No. PCT/EP2007/001190, filed on Feb. 12, 2007.

METHOD FOR EXCHANGING SEMICONDUCTOR CHIP OF FLIP-CHIP MODULE AND FLIP-CHIP MODULE SUITABLE THEREFOR

RELATED APPLICATIONS

This application is a Continuation of PCT Application Number PCT/EP2007/001190 filed on Feb. 12, 2007, which claims priority to German Patent Application No. DE 10 2006 006 561.1, filed on Feb. 13, 2006, both of which are incorporated herein by reference in their entirety.

FIELD OF THE INVENTION

The invention relates to a process for replacing a semiconductor chip of such a flip-chip module and a flip-chip module suitable for this. The flip-chip module comprises a semiconductor chip having contact posts at one surface, which are disposed approximately at right angles to the surface, and a substrate having contact points which are soldered to the free ends of the contact posts.

BACKGROUND OF THE INVENTION

A flip-chip module is known from U.S. Pat. No. 6,578,754 B1. The contact posts consist of a portion containing substantially copper and a shorter portion consisting of solder material which is connected to the contact points of the substrate. The length of the copper portion is at least 50 micrometers (μm). Contact points are to be contactable with these contact posts, which are disposed in a regular grid, whose grid distance, which is smaller than 100 μm, is preferably in the range of from 80 to 100 μm.

Due to the provision of defined contact posts considerable advantages are obtained as compared with conventional flip-chip modules, which, above all, are that the risk of a short circuit between adjacent contact points is by far less than in conventional flip-chip modules, in which the connection between the substrate and the semiconductor chip is implemented alone with approx. spherical contact elements of solder material. Consequently, it is possible to reliably contact points in a grid of less than 100 μm.

Reference is also made to U.S. Pat. No. 6,550,666 B2 and U.S. Pat. No. 6,592,019 B2, in which further embodiments of the flip-chip module described above are set forth.

Moreover, the flip-chip modules have all advantages of conventional flip-chip modules as compared with wire bonding. The path of the electric conductance between the semiconductor chip and the substrate and thus the signal path is in particular very short.

There is a considerable need to contact several DRAM memory chips by means of a flip-chip module directly without the use of an additional wiring plane, since, on the one hand, due to the plurality of the connections, the conventional contacting by means of wires is practically hardly implementable and, on the other hand, the desired data transfer rates are not possible with conventional wire bondings.

The contact points of these DRAM memory chips are disposed at a grid distance of less than 100 μm, which is referred to as "fine pitch" in the technical jargon. Such a fine pitch can be contacted with the contact posts explained above. Conventional contacting technologies for flip-chip modules are not suitable for this. Moreover, it must be taken into consideration that low k passivation materials are increasingly used for the strip conductors within the chip, which are mechanically weak, for which reason a mechanical tension exerted on such a semiconductor chip results in cracks and fractures in the passivation layer.

The German patent applications DE 10 2005 043910 and DE 10 2005 050150, which have not been published so far, reveal a flip-chip module having a semiconductor chip having contact posts, the contact posts being electrically and mechanically connected with a substrate. A spacer is provided between the substrate and the semiconductor chip which is mechanically coupled at least to the substrate. Due to this, thermal tensions in the flip-chip module are absorbed by the spacer and kept away from the semiconductor chip.

A flip-chip module is revealed by U.S. Pat. No. 6,225,206 B1, which comprises a first substrate which is a chip or a module and a second substrate which is a chip carrier or a circuit card, if the first substrate is a chip. One conductive body each of solder material in the form of a post is formed on the first substrate, the chip, at the contact points. The post may have a height of 50 mils up to about 87 mils. A contact point of the second substrate is electrically connected with this post, a contact bump being provided between the contact point and the post.

U.S. Pat. No. 6,050,476 discloses a flip-chip module, in which a chip is connected with a substrate by means of cold soldering. Here, thin layers of indium are provided on the surfaces of the contact points of the chip and the substrate. If two such contact points are contacted with each other and subjected to pressure, then they are mechanically and electrically connected (cold soldering). Here, the contact points of the chip are preferably substantially larger than the contact points of the substrate, whereby it is possible to position the contact points of the substrate at several different points of the respective contact surface of the chip, which do not overlap each other. This permits the removal of a chip from a substrate and the renewed use of the chip, wherein, in the case of a renewed use, other areas of the contact points are connected in each case with the contact points of the new substrate.

Relatively expensive apparatuses and methods for the reprocessing of flip-chip modules are revealed by U.S. Pat. No. 6,182,884 B1 and DE 199 03 957 A1, with which a soldered connection can be separated and the corresponding solder can be removed.

In all known embodiments of a flip-chip module with a semiconductor chip having contact posts a layer of solidified solder is in each case disposed between the contact points of the substrate and the contact posts.

The semiconductor chips once attached to a substrate cannot be replaced in flip-chip modules. This applies likewise to the flip-chip modules explained above, which have contact posts that are disposed at right angles on the surface of a semiconductor chip and to conventional flip-chip modules such as e.g. ball grid array (BGA) flip chip modules, in which the semiconductor chips are directly connected with the contact points on the substrate by means of a solder globule. Moreover, the soldering methods used here are very expensive since a mask of insulating material must be provided, which ensures that the solder of a specific contact point does not get into contact with a further contact point during soldering and generates a short circuit. It is common to all these flip-chip modules that, upon the separation of the soldered connection, a remainder of the solder remains on the respective contact points of the substrate. The amount of this remainder is not defined, due to which different elevations due to the remainders of the solder are formed at the contact points. A substrate with such uneven contact points can no longer be reliably contacted with a semiconductor chip.

On the other hand, flip-chip modules have already been available for quite some time, which comprise several semiconductor chips on a substrate. If it turns out that a semiconductor chip does not correctly function, then the entire flip-chip module is waste even if the further semiconductor chips on the flip-chip module should be all right, since a single semiconductor chip cannot be replaced.

In order to avoid such problems all semiconductor chips would have to be individually tested in advance. However, the testing of semiconductor chips is very expensive, whereas the testing of a flip-chip module is substantially less expensive than the implementation of several separate tests for the respective semiconductor chips, since the entire flip-chip module can be tested in one testing process and the contact points of a flip-chip module are accessible in a substantially more simple fashion than those of a semiconductor chip.

General economic factors determine whether manufactures risk the high costs of the several individual tests of the semiconductor chips or the high costs of the waste of complete flip-chip modules.

SUMMARY OF THE INVENTION

The invention is based on the object of providing a method for replacing a semiconductor chip of a flip-chip module, which can be implemented in a simple and reliable fashion.

In general, according to one aspect, the invention features a flip-chip module comprising at least one semiconductor chip and a substrate, in which it is possible to remove the semiconductor chip from the substrate and to reliably reconnect the substrate with another semiconductor chip.

In general, according to another aspect, the invention features a method for replacing a semiconductor chip of a flip-chip module. The flip-chip module is formed from a semiconductor chip which comprises contact posts being disposed approximately at right angles to the surface on one surface, which have end faces at their free ends, and a substrate, which has contact points on one surface, which are in each case connected with one of the end faces of one of the contact posts by means of soldered connections, the contact points being raised relative to the surface of the substrate and the end faces of the contact posts completely covering the respective contact point. The method comprises the following steps:

heating of the existing soldered connections above the flow point, pressing together the semiconductor chip and the substrate so that the solder is almost completely pressed out of the areas between the end faces of the contact posts and the contact points, removing the semiconductor chip from the substrate, attaching a further semiconductor chip.

Thus, in the method for replacing a semiconductor chip of such a flip-chip module according to the invention, the existing soldered connections are heated above the flow point, the semiconductor chip and the substrate are pressed together so that the solder is almost completely pressed out of the areas between the end faces of the contact posts and the contact points, the semiconductor chip is removed from the substrate and a further semiconductor chip is attached thereto.

Due to this, it is ensured that no amounts of solder remain in the contact area between the contact points and the contact posts, which would impede a re-attachment of a further semiconductor chip.

The flip-chip module according to the invention comprises:

at least one semiconductor chip which has contact posts on one surface, which are disposed approximately at right angles to the surface and which have end faces at their free ends;

a substrate having contact points at one surface, which are respectively connected with one of the end faces of one of the contact posts, wherein the end faces of the contact points completely extend beyond the respective contact point.

Since the end faces of the contact posts completely cover the respective contact point, it is possible that in the case of a renewed conversion of the solder of soldered connections into the flowable state, the semiconductor chip and the substrate can be pressed together, due to which the entire solder is pressed out of the area between the end faces of the contact posts and the contact points. Since the contact points are completely covered by the end faces of the contact posts, the contact points are completely covered by the end faces of the contact posts in the compressed state, due to which the contact points are almost completely free from solder and again form a plane contact surface.

In the case of a renewed placing of a semiconductor chip on the contact points the remainder of the solder located on the circumferential area does not get in the way. Since the contact point with its contact surfaces may be free, a further semiconductor chip can be exactly positioned on the contact points and a new soldered connection can be formed at the circumferential area. Here, the solder that is newly fed is connected with the already existing remainders of solder without any impairments being caused by this.

Thus, such a flip-chip module permits a replacing of the semiconductor chip located thereon.

In the case of such flip-chip modules it is thus a good idea not to test the individual semiconductor chips separately, before they are applied onto the substrate, but to test the entire flip-chip module as a unit, which is essentially more advantageous than the individual tests of the semiconductor chips. Defective semiconductor chips can be replaced after a corresponding test.

The contact points of the substrates are preferably designed in a somewhat raised fashion with respect to the surface of the substrate. Due to this, it is ensured that the remainder of solder which remains on the substrate after the separation of a semiconductor chip is deposited at the circumferential area of the contact points and does not remain on the surfaces pointing towards the semiconductor chip of the contact points, i.e. the contact surfaces. Thus, the remainder of the solder is below the level of the contact surfaces of the contact points.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

A flip-chip module 1 according to the invention (FIG. 1a, 1b) comprises a semiconductor chip 2 having I/O contact points on one surface 3. Contact posts 4 are disposed at the I/O contact points, which stand in each case vertically on the surface 3.

Figure 1A:
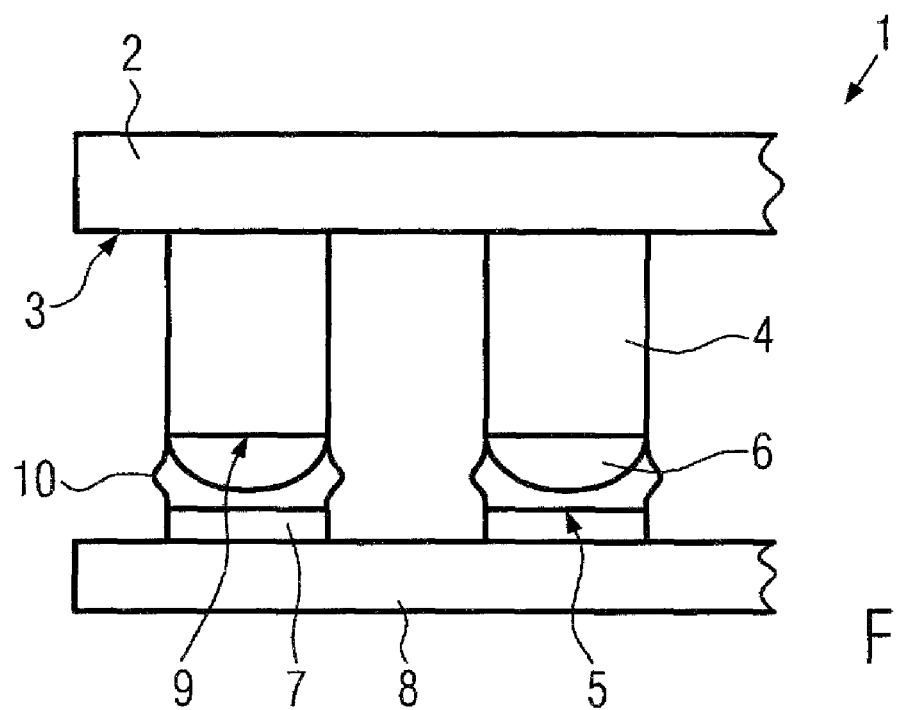
FIGS. 1a and 1b are schematic drawings showing the attachment of a semiconductor chip on a substrate of a flip-chip module according to the invention.

These contact posts are produced in accordance with a method as it is described in U.S. Pat. No. 6,578,754 B1, U.S. Pat. No. 6,550,666 B1 and/or U.S. Pat. No. 6,592,019 B2. For this reason, reference is made to the complete content of these patents and they are incorporated into the present application by this reference. The contact posts 4 have end faces 9 at their free ends, on which a contact bump 6 each is disposed (FIG. 1a). The length of the contact posts is at least 20 μm and is preferably in the range of 50 μm to 100 μm. The metal post 5 is above all made of copper and/or gold, is directly disposed on the semiconductor chip 2 and is in electrical contact with a strip conductor of the semiconductor chip 2. The contact bumps 6 are disposed at the ends of the contact posts 4, which are located at a distance from the semiconductor chip 2, and serve for the mechanical and electrical connection with contact points 7 of a substrate 8. The contact bumps 6 are disposed on end faces 9 of the free ends of the substrate 8. The solder of the contact bumps 6 is e.g. an alloy of tin and lead or lead-free solder.

The end faces 9 of the contact posts 4 completely cover the contact points 7 with a slight projection. This means that the end faces 9 are at least somewhat larger than the area of the respective contact point 7 in the top view and are disposed such that the respective contact point 7 is completely located below the corresponding end face 9. Here, the end surface 9 and the respective contact point 7 must not be in contact. As a rule, the end face 9 can and should also be somewhat spaced from the contact point 7. The projection of the contact posts is preferably formed on the entire circumference vis-à-vis the contact points.

Preferably, the contact points 7 are formed in a somewhat raised fashion with respect to the surface of the substrate 8.

Figure 1B:
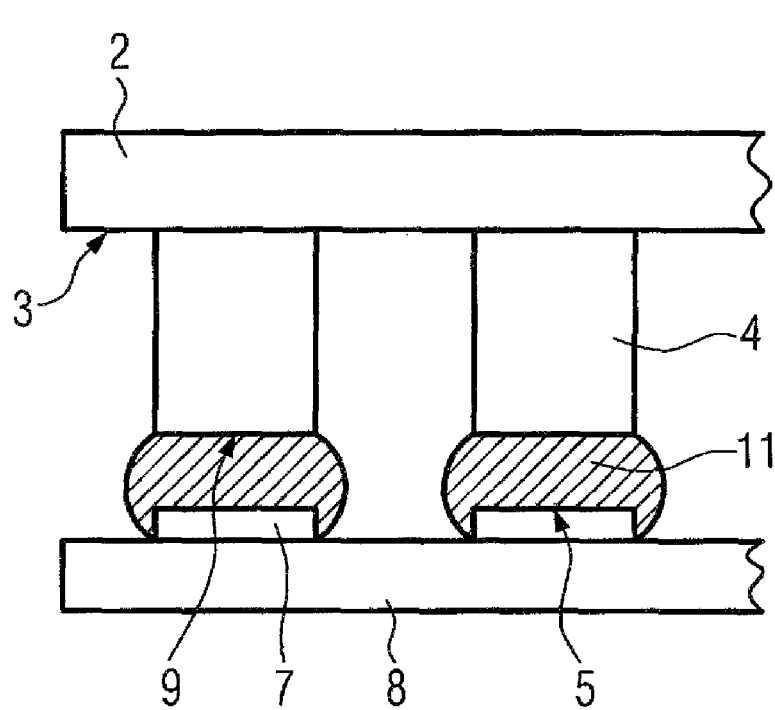

The flip-chip module according to the invention is represented during the soldering process in FIG. 1a. The contact bump 6 and the contact points 7 are wetted with fluxing material 10. The fluxing material 10 is typically applied onto the contact points 7 and/or onto the contact bumps 6 in advance. The solder is brought into the flowable state by means of heating and into contact with the respective contact point 7 during the soldering process. The solder flows around the contact point 7 and forms an intermetallic connection with it. After cooling the solder solidifies and the semiconductor chip is both mechanically and electrically connected with the substrate (FIG. 1b).

No masks as they are customary in BGA flip-chip modules must be used during this soldering process. The solder remains in the intermediate area between the end faces and the respective contact point 7 and the solidified solder 11 may also comprise the circumferential area of the contact point 7.

Figure 2A:
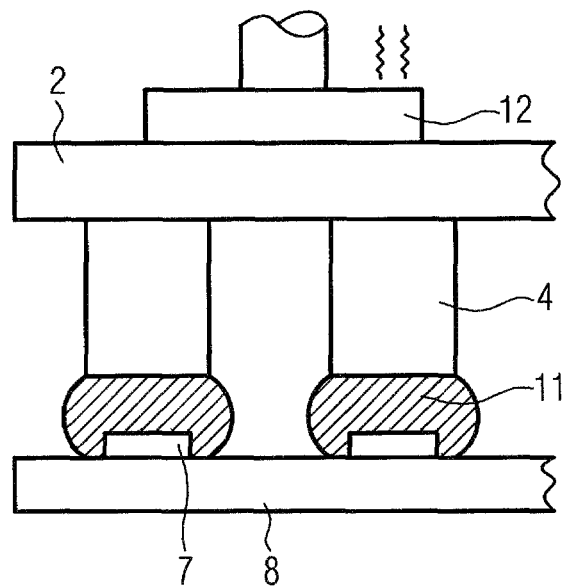
FIG. 2a to 2c are schematic drawings showing the detachment of the semiconductor chip from the substrate of a flip-chip module according to the invention.
Figure 2B:
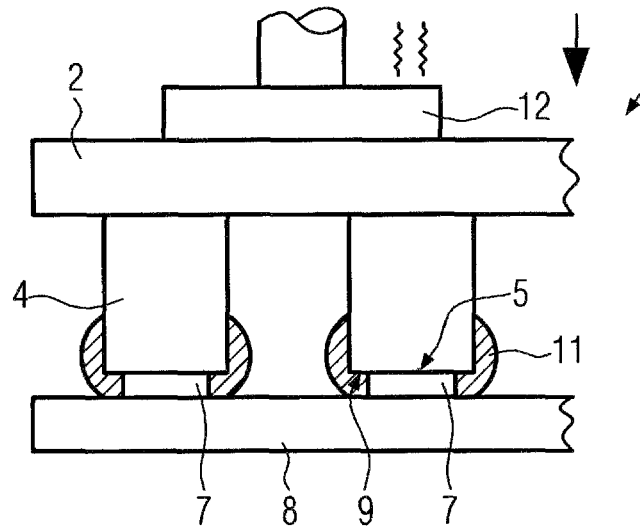
Figure 2C:
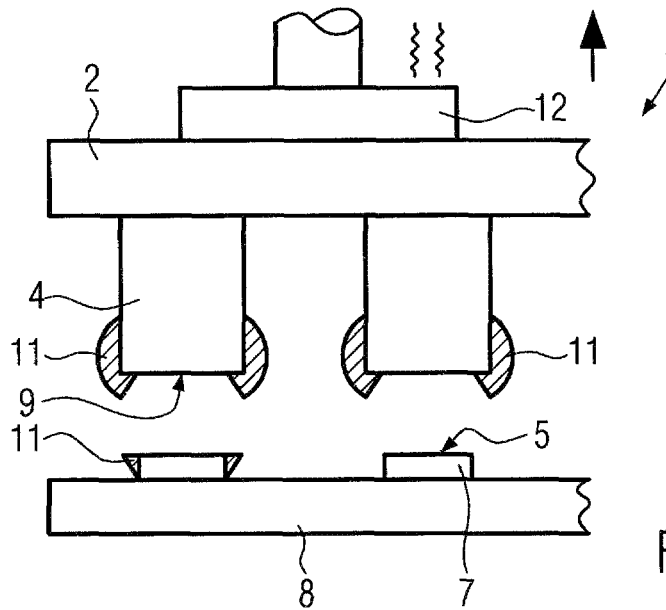

The detachment of the semiconductor chip 2 from the substrate 8 is shown in FIGS. 2a to 2c.

At first, the soldered connections between the semiconductor chip 2 and the substrate 8 are heated so that the solder 11 again adopts a flowable state. The heating is carried out by means of a hot punch 12, which presses on the semiconductor chip 2 to be removed from above. Then, the heat flows from the punch 12 to the solder 11 via the semiconductor chip 2 and the contact posts 4.

If the solder 11 is in the flowable state, the semiconductor chip 2 and the substrate 8 are pressed together. This is implemented by means of the punch 12, which presses onto the semiconductor chip 2 from above. Due to this, the flowable solder is pressed out of the areas between the end faces 9 and the surfaces of the contact points 7 facing the end faces 9, the contact surfaces 5. Due to this, the end faces 9 are in contact with the respective contact points 7. Since the end faces 9 completely cover the contact points 7, the contact surfaces 5 of the contact points 7 are almost completely free from solder (FIG. 2b).

The state, in which the end faces 9 are in contact with the contact points 7, is automatically recognized by means of a pressure sensor. Then, the temperature of the punch 12 is reduced so that the solder 11 again cools to somewhat below the flow point, whereby the solder is somewhat solidified.

The semiconductor chip 2 is removed from the substrate, e.g. by applying a subpressure to the punch, with which suction is applied to the semiconductor chip 2 by the punch 12 so that upon the lifting of the punch 12 the semiconductor chip 2 is removed. However, a mechanical gripper can also be used for lifting off the semiconductor chip 2.

It is apparent that most of the solder 11 adheres to the contact posts 4. Only small residual amounts remain adhered to the circumferential areas of the contact points 7. The contact surfaces 5 of the contact points 7 are almost completely free from solder so that the contact points 7 again form defined contact surfaces 5 that are suitable for receiving a further semiconductor chip.

The projection of the contact posts 4 with respect to the contact surfaces 5 is advantageous, since, during cooling of the solder to below the flowpoint, the solder adheres above all to the contact post, since it has a larger area of contact with the contact post. The larger the area of contact between the solder and the contact post 4 is as compared with the area of contact between the solder and the contact point 7, the more reliably can the solder be removed from the contact area 5.

Figure 3A:
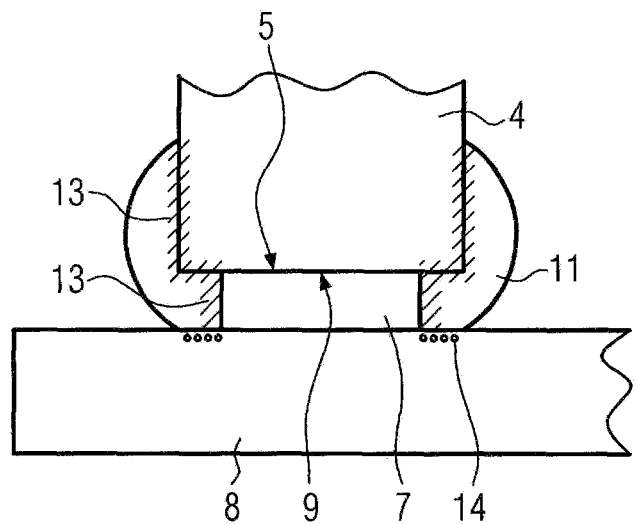
FIG. 3a to 3c are schematic drawings showing the connection area between a contact post and a contact point during the replacing of a semiconductor chip.
Figure 3B:
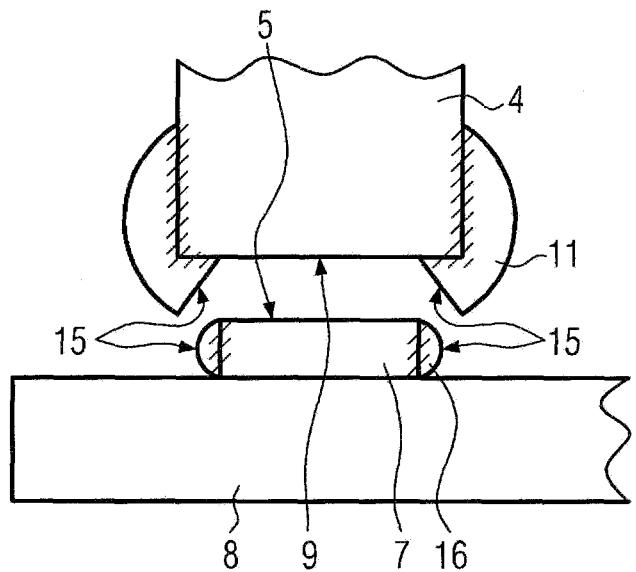
Figure 3C:
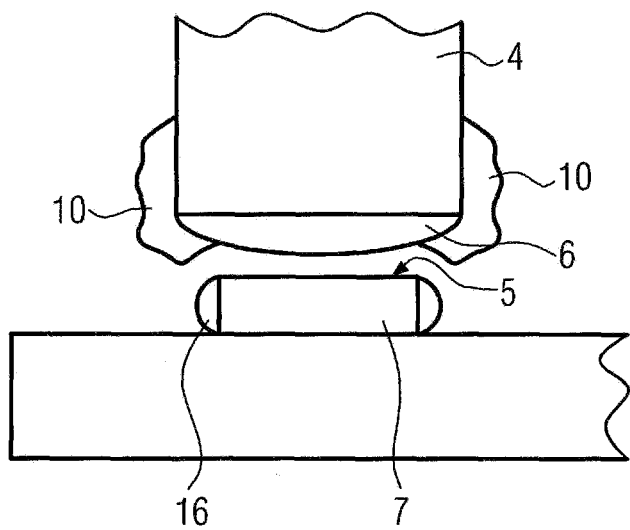

FIG. 3a shows the contact area between a contact post 4 and the corresponding contact point 7, which are in contact here. The solder 11 is pressed out of the intermediate area and adheres to the circumference of the contact post 4, the section of the end face 9 which extends beyond the contact point 7 and to the circumference of the contact point 7. An intermetallic compound 13 is formed between the solder and the contact point 7 and the contact post 4. The solder adheres substantially more weakly to the substrate than to the metallic contact point 7 and the metallic contact post 4 at the interface 14 between the substrate 8 and the solder. Upon the lifting of the semiconductor chip 2 and the corresponding contact post 4 the solder cracks and, due to the shearing forces, forms cracking surfaces 15 which extend from the respective end face 9 obliquely towards below. The remaining solder 16 at the contact points 7 thus extends from the edges of the contact points 7 obliquely downwards and thus does not extend beyond the upwardly pointing contact surfaces 5 of the contact points 7. Thus, the contact points 7 again have smooth defined contact surfaces 5.

A further semiconductor chip can again be attached to the substrate 8. For this purpose, a semiconductor chip 2 with its contact posts is soldered to the corresponding contact points 7 of the substrate as it is described above by means of FIGS. 1a and 1b. The solder remainders 16 at the contact points 7 are connected with the newly added solder 6 of the new semiconductor chip 2.

Thus, the flip-chip module according to the invention permits a safe removal of a semiconductor chip in a simple fashion, reusable contact points 7 being again exposed on the substrate. It is essential for this that the end faces 9 completely cover the contact points 7 and/or their contact surfaces 5, so that the solder can be almost completely pressed out of the intermediate area by compressing the end faces 9 and the contact surfaces 5.

The end faces 9 are preferably larger than the contact surfaces 5 so that, on average, they e.g. project by approx. 2 μm to 10 μm and preferably by approx. 3 μm to 5 μm beyond the edge of the contact points. Due to this, it is ensured that no solder adhering to the contact points 7 gets again into contact with the contact surfaces 5 during lifting.

Moreover, it is advantageous if the contact points 7 are formed in a raised fashion with respect to the surface of the substrate 8, since then, the solder remainders 16 may remain on the substrate, after a separation of the semiconductor chip 2 from the substrate 8, and, however, they remain below the level of the contact surfaces 5 and, thus, they no longer interfere with a further contacting. The height of the contact points is approx. 10 μm to 50 μm and is preferably in the range of from 15 μm to 25 μm.

The quality of the connection between the substrate and the semiconductor chip 2 after the replacing of a semiconductor chip 2 is as good as after first connection of the semiconductor chip with the substrate in the flip-chip module according to the invention.

Moreover, it turned out that this system of contact post, contact bump and raised contact point is self-centering.

Upon a pressing together of the semiconductor chip 2 and the substrate, the contact points 7 form in each case a stop element against which the contact posts 4 strike.

Moreover, embodiments of the invention include an apparatus for implementing the method explained above for replacing a semiconductor chip in a flip-chip module. This apparatus comprises the punch 12 for applying pressure to the semiconductor chip 2. The punch is formed with a heating device for heating the semiconductor chip 2 and a handling device for exerting a mechanical pressure on the punch 12. The punch is preferably provided with a vacuum device for applying suction to the semiconductor chip. However, it is also possible that an additional gripper for the automatic gripping and moving of a semiconductor chip is provided.

The present invention can also be used with a flip-chip module as it is described in the German patent application DE 10 2005 043 910 and/or DE 10 2005 050 150 and/or PCT/EP2006/008921. Reference is made to the complete content of these patent applications and they are incorporated into the present application by means of reference.

The invention can be briefly summarized as follows:

The present invention relates to a flip-chip module, a method for replacing a semiconductor chip of such a flip-chip module and an apparatus for implementing the method.

The flip-chip module comprises at least one semiconductor chip and a substrate. The semiconductor chip comprises contact posts on a surface, which are disposed approximately at right angles to the surface. It is connected with these contact posts via a soldered connection with contact points of the substrate. The contact posts completely cover the contact points with their end faces. Due to this, it is possible to completely press the solder between the contact posts and contact points out of the intermediate area between the contact points and the contact posts after a renewed heating. This permits a renewed attachment of a further semiconductor chip.

LIST OF REFERENCE NUMERALS

1-Flip-chip module; 2-Semiconductor chip; 3-Surface; 4-Contact post; 5-Contact surface; 6-contact bump; 7-Contact point; 8-Substrate; 9-End face; 10-Fluxing material; 11-Solder; 12-Punch; 13-Intermetallic connection; 14-Interface; 15-Crack surface; and 16-Solder remainder.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for replacing a semiconductor chip of a flip-chip module, the semiconductor chip comprising contact posts on a surface, which are disposed approximately at right angles to the surface, which have end surface areas at their free ends, and a substrate having contact points with surface areas connected respectively with the end surface areas of the contact posts by soldered connections, wherein the contact points are raised relative to the surface of the substrate and the end surface areas of the contact posts cover the respective surface areas of the contact points, the method comprises:

heating existing soldered connections above a flow point of said contact posts having been soldered to the raised contact points, whereby the end surface areas of the contact posts are larger than the surface areas of the raised contact points;

pressing together the semiconductor chip and the substrate to press the solder almost completely away from the end surface areas of the contact posts and the surface areas of the raised contact points;

reducing a temperature of the soldered connections prior to removal of the chip in order to somewhat solidify the solder so that a majority of the pressed out solder adheres to sides of the contact posts; and removing the semiconductor chip from the substrate with the majority of the solder adhering to the sides of the contact posts, whereby cleaning of the raised contact points is not required to accommodate soldering the same or another semiconductor chip to the raised contact points, and cleaning of the contact posts is not required to accommodate soldering the contact posts of said semiconductor chip to the same or other raised contact points.

2. The method according to claim 1, wherein the heating of the existing soldered connections is effected by heating the semiconductor chip with the heat being directed to the soldered connections via the contact posts.

3. The method of claim 1 further comprising soldering contact points of a second semiconductor chip to the raised contact posts of the flip-chip module without first cleaning said raised contact posts.

* * * * *